(12) United States Patent
Kani et al.

(10) Patent No.: US 8,531,569 B2
(45) Date of Patent: Sep. 10, 2013

(54) CCD-TYPE SOLID-STATE IMAGING DEVICE, DRIVING METHOD FOR CCD-TYPE SOLID-STATE IMAGING DEVICE, AND IMAGING SYSTEM

(75) Inventors: Yuya Kani, Fukuoka (JP); Katsumi Yamagishi, Kanagawa (JP)

(73) Assignee: Sony Corporation, Tokyo (JP)

( * ) Notice: Subject to any disclaimer, the term of this patent is extended or adjusted under 35 U.S.C. 154(b) by 478 days.

(21) Appl. No.: 12/926,619

(22) Filed: Nov. 30, 2010

(65) Prior Publication Data

US 2011/0134299 A1 Jun. 9, 2011

(30) Foreign Application Priority Data

Dec. 9, 2009 (JP) ................................ P2009-279779

(51) Int. Cl.
*H04N 5/335* (2011.01)
(52) U.S. Cl.
USPC ........................................................ 348/312
(58) Field of Classification Search
USPC .................... 348/294, 312–324; 257/222
See application file for complete search history.

(56) References Cited

U.S. PATENT DOCUMENTS

| 4,589,024 A * | 5/1986 | Koch et al. ..................... 348/297 |
| 7,738,021 B2 | 6/2010 | Iwamoto |
| 2010/0039541 A1* | 2/2010 | Hirota et al. ................... 348/250 |
| 2011/0134299 A1* | 6/2011 | Kani et al. ..................... 348/312 |

FOREIGN PATENT DOCUMENTS

JP 2006-140411 6/2006

\* cited by examiner

*Primary Examiner* — Aung S Moe
(74) *Attorney, Agent, or Firm* — Rader, Fishman & Grauer PLLC

(57) ABSTRACT

A CCD-type solid-state imaging device includes: light receiving devices arranged in vertical and horizontal directions; vertical transfer parts arranged along vertical rows of the arranged light receiving devices, reading out charge accumulated in the adjacent light receiving devices, and transferring the read out charge in the vertical direction; a horizontal transfer part supplied with the charge transferred in the vertical transfer parts and transferring the supplied charge in the horizontal direction; an output part outputting the charge transferred in the vertical transfer parts; an input terminal for readout and transfer clocks that command readout of the charge from the light receiving devices and transfer of the read out charge in the vertical transfer parts; a resistor connected between the input terminal and a clock supply part of the vertical transfer parts; and a switch part connected to the resistor in parallel and switching between the charge readout and the charge transfer in the vertical transfer parts.

6 Claims, 7 Drawing Sheets

CONFIGURATION EXAMPLE OF FIRST EMBODIMENT

CONFIGURATION EXAMPLE OF FIRST EMBODIMENT

CONFIGURATION EXAMPLE OF ENTIRE CAMERA SYSTEM

EXAMPLE OF DRIVE PULSE

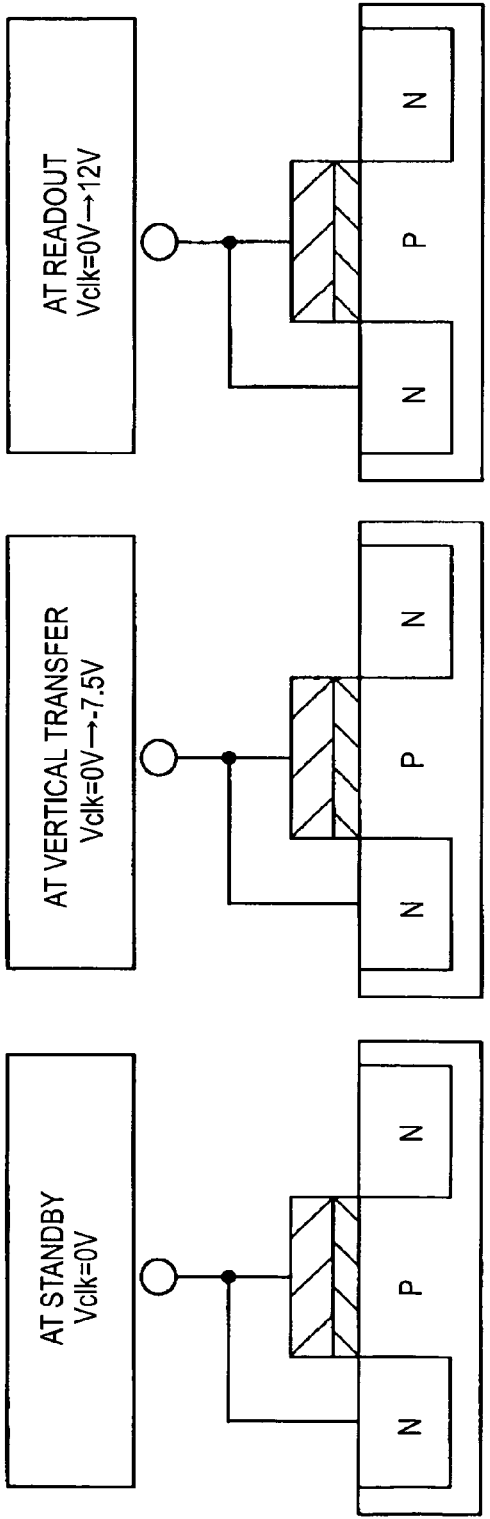
FIG.4A AT STANDBY Vclk=0V
FIG.4B AT VERTICAL TRANSFER Vclk=0V→-7.5V
FIG.4C AT READOUT Vclk=0V→12V
EXAMPLES OF VOLTAGES APPLIED TO SUBSTRATE CLOCK WAVEFORM AT VERTICAL TRANSFER VOLTAGE INPUT (Tr OFF)

CLOCK WAVEFORM AT READOUT VOLTAGE INPUT (Tr ON)

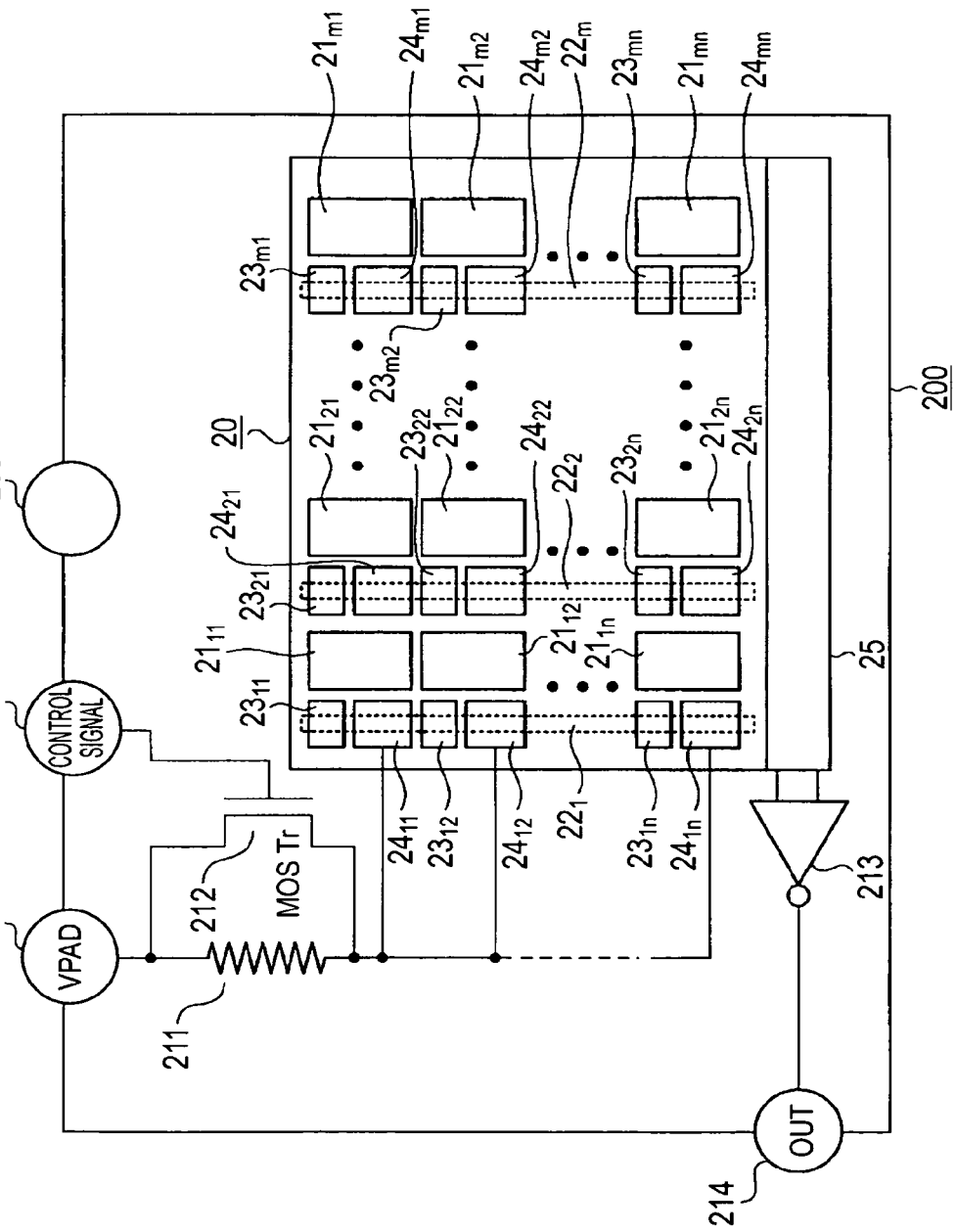

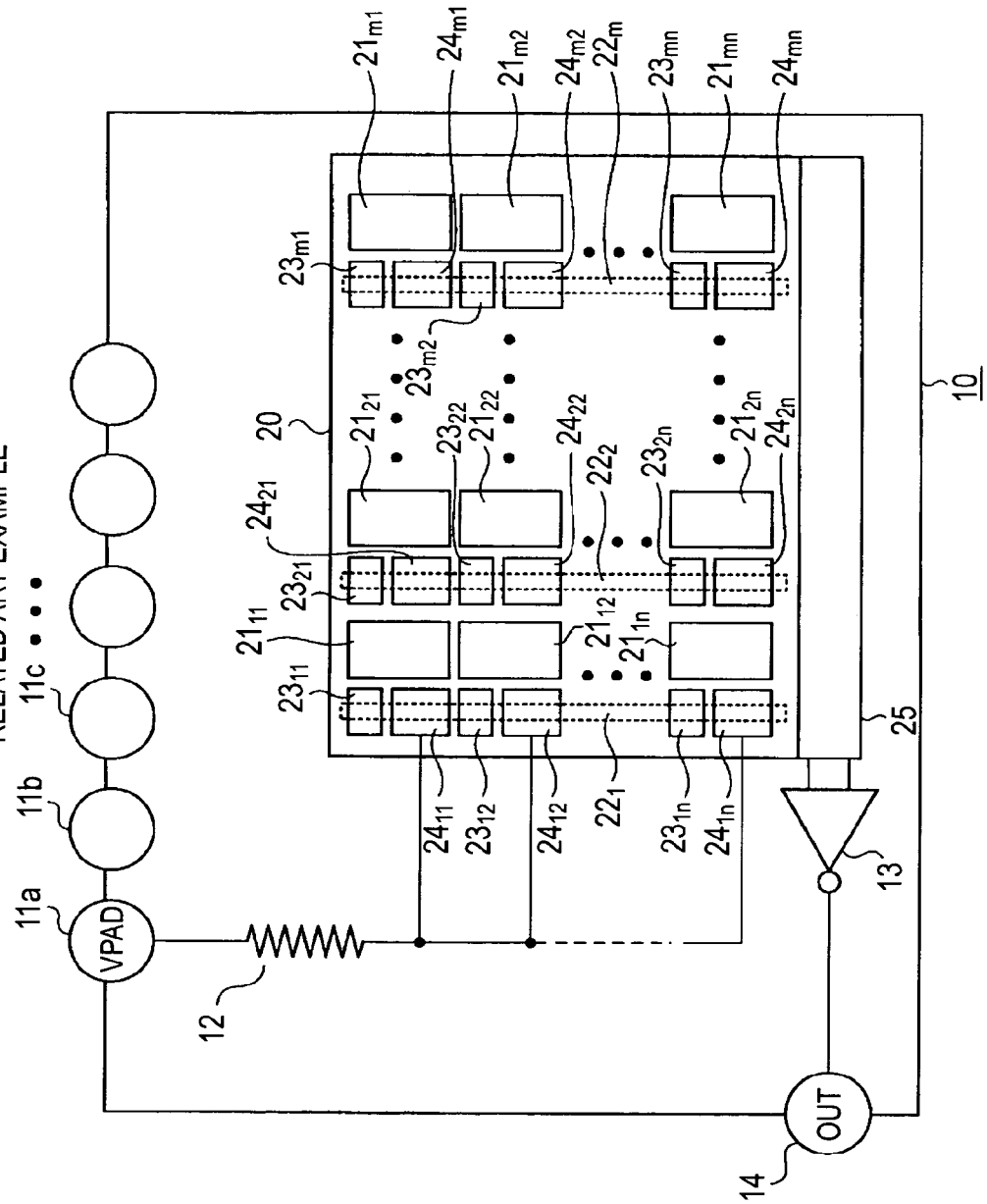

CLOCK WAVEFORM AT VERTICAL TRANSFER VOLTAGE INPUT

CLOCK WAVEFORM AT READOUT VOLTAGE INPUT

CCD-TYPE SOLID-STATE IMAGING DEVICE, DRIVING METHOD FOR CCD-TYPE SOLID-STATE IMAGING DEVICE, AND IMAGING SYSTEM

BACKGROUND OF THE INVENTION

1. Field of the Invention

The present invention relates to a CCD-type solid-state imaging device, a driving method applied to the CCD-type solid-state imaging device, and an imaging system including the CCD-type solid-state imaging device.

2. Description of the Related Art

In related art, a CCD (Charge Coupled Device)-type solid-state imaging device is known as a solid-state imaging device. The CCD-type solid-state imaging device has a configuration to obtain image signals by sequentially transferring charge accumulated in light receiving devices forming pixels using a CCD as a charge coupled device and outputting it.

FIG. 7 shows an example of a CCD-type solid-state imaging device in related art.

The explanation of the configuration of FIG. 7 is as follows. A CCD-type solid-state imaging device 10 includes an imaging region 20, and photodiodes 21 as light receiving devices forming pixels arranged in predetermined numbers in the horizontal direction and the vertical direction within the imaging region. In each photodiode 21, signal charge is accumulated by receiving light.

In the example of FIG. 7, photodiodes $21_{11}, 21_{12}, \ldots, 21_{1n}$ are arranged on a vertical line at the left end, and photodiodes $21_{21}, 21_{22}, \ldots, 21_{2n}$ are arranged on a vertical line on the immediately right. In this way, photodiodes $21_{m1}, 21_{m2}, \ldots, 21_{mn}$ are arranged on a vertical line at the right end. The n in this specification is the number of pixels in the vertical direction and m is the number of pixels in the horizontal direction. Accordingly, the photodiodes 21 are arranged in a matrix of n in the vertical direction and m in the horizontal direction.

On the sides of the photodiodes $21_{11}$ to $21_{1n}$, $21_{21}$ to $21_{2n}, \ldots, 21_{m1}$ to $21_{mn}$, vertical transfer channels $22_1, 22_2, \ldots, 22_n$ are arranged. The vertical transfer channels $22_1$ to $22_n$ include CCDs as charge coupled devices and transfer charge. As shown in FIG. 7, in the respective vertical transfer channels $22_1$ to $22_n$, transfer electrodes $23_{11}$ to $23_{mn}$ and readout-transfer electrodes $24_{11}$ to $24_{mn}$ are alternately arranged. The readout-transfer electrodes $24_{11}$ to $24_{mn}$ read out signal charge accumulated in the adjacent photodiodes $21_{11}$ to $21_{mn}$, and transfer the read out signal charge (or transferred signal charge) to the next transfer electrodes (the lower electrodes in the drawing). The transfer electrodes $23_{11}$ to $23_{mn}$ transfer the charge transferred from the upper electrodes 24 to the lower electrodes 24.

The readout operation and the transfer operation in these readout-transfer electrodes $24_{11}$ to $24_{mn}$ and the transfer operation in the transfer electrodes $23_{11}$ to $23_{mn}$ are performed in synchronization with a vertical transfer clock externally supplied via an input terminal 11a or the like.

To the lower ends of the respective vertical transfer channels $22_1$ to $22_n$, a horizontal transfer channel 25 is connected, and the charge transferred in the respective vertical transfer channels $22_1$ to $22_n$ is supplied to different electrode positions of the horizontal transfer channel 25 with respect to each vertical line. The charge transferred to the horizontal transfer channel 25 is supplied to an output circuit 13 connected to the end of the horizontal transfer channel 25 in synchronization with a horizontal transfer clock, and imaging signals are externally output from an output terminal 14 connected to the output circuit 13.

Thus far, a general configuration as the CCD-type solid-state imaging device has been explained.

Further, the CCD-type solid-state imaging device 10 in the example of FIG. 7 supplies the clocks for controlling the readout operation and the transfer operation in the readout-transfer electrodes $24_{11}$ to $21_{mn}$ within the vertical transfer channels $22_1$ to $22_n$ to the respective electrodes $24_{11}$ to $24_{mn}$ from the input terminal 11a via a resistor 12. The resistor 12 may have a resistance value of about several tens of ohms to several hundreds of ohms, for example. To supply the clock via the resistor 12 is for the purpose of making the pulse waveform of the transfer clock proper. The specific examples of the pulse waveform will be described later.

In JP-A-2006-140411, an example of the CCD-type solid-state imaging device is described, and an example of a configuration using transfer electrodes of vertical transfer resistors as readout electrodes is described.

SUMMARY OF THE INVENTION

As shown in FIG. 7, in the case where the vertical transfer channels 22 within the CCD-type solid-state imaging device perform the charge readout operation from the photodiodes 21 and the transfer operation within the transfer channels 22, the transfer clock is changed at charge readout and charge transfer.

Specifically, as shown in FIGS. 8A and 8B, for example, the pulse waveform of the clock supplied at charge transfer within the vertical transfer channels 22 is a voltage waveform falling from a reference value VM to a predetermined voltage VL as shown in FIG. 8A. For example, the reference value VM is set to 0 V, and the predetermined voltage VL is set to −7.5 V.

On the other hand, the pulse waveform of the clock supplied at charge readout from the photodiodes 21 is a voltage waveform rising from the reference value VM to a predetermined voltage VT as shown in FIG. 8B and having reversed polarity to that of the pulse waveform at transfer. For example, the reference value VM is set to 0 V, and the predetermined voltage VT is set to 12 V.

In this manner, the readout from the photodiodes and the transfer within the vertical transfer channels of the charge are switched by the polarity of the pulse waveform. Note that the pulse waveforms shown in FIGS. 8A and 8B are waveforms blunted by the action of the resistor 12. This point will be described later. Further, in the transfer electrodes $23_{11}$ to $23_{mn}$ shown in FIG. 7, only the transfer operation is performed and only the transfer clock is supplied thereto.

Here, as shown in FIG. 7, the clock that has been supplied to the input terminal 11a is supplied to the readout-transfer electrodes $24_{11}$ to $24_{mn}$ via the resistor 12 for optimization of the clock waveform. The optimization of the clock waveform will be explained as follows. In the vertical transfer of the CCDs, the slower the transition time of the signal charge, the more improved the transfer efficiency. If this is applied to the input clock waveform at vertical transfer shown in FIG. 8A, when the clock waveform transits from the voltage VM to the voltage VL, the smaller the value of ΔV/Δt as a change rate of the voltage and the larger the value of time tf in which the waveform changes, the more improved the transfer efficiency. To realize the waveform under the condition, there is a configuration in which adjustment of blunting the waveform is made by inserting the resistor 12 between the input terminal 11a and the readout-transfer electrodes $24_{11}$ to $24_{mn}$ as shown in FIG. 7.

On the other hand, when the resistor 12 is inserted, also the waveform of the readout pulse from the photodiodes is blunted. That is, by inserting the resistor 12 in the transmission channel of the clock, also, in the waveform of the readout pulse, the value of the voltage change rate ΔV/Δt becomes smaller as shown in FIG. 8B.

The ease of signal readout from the photodiodes depends on the length of a time period twh1 in which the voltage VT in the waveform as shown in FIG. 8B is applied. That is, if the time period twh1 is insufficient, when the impurity profiles and the finished electrode structures around the CCD pixels vary, in some pixels, the signal photoelectrically converted in the photodiode may not completely be transferred to the vertical transfer channel. As a result, the output signal decreases compared to the surrounding pixels and a defect such as black flaw occurs.

If the resistor 12 is inserted, the voltage change rate ΔV/Δt value in the waveform of FIG. 8B becomes smaller and a time period tr1 in which the voltage changes becomes longer, and the time period twh1 in which the voltage VT is applied becomes shorter, and, as a result, it becomes highly possible that the black flaw defect occurs.

As described above, in the solid-state imaging device having the structure in which the vertical transfer electrodes also serve as the readout electrodes from the photodiodes, the resistor may be inserted between the clock input terminal and the vertical transfer electrodes for the purpose of improvement of the vertical transfer efficiency. However, due to the inserted resistor, the black flaw caused by the incomplete signal readout may occur.

Thus, it is desirable to eliminate a defect at readout from light receiving devices in a solid-state imaging device having a structure in which vertical transfer electrodes also serve as the readout electrodes from the light receiving devices.

According to an embodiment of the invention, there is provided an imaging device of using vertical transfer parts that are arranged along vertical rows of plural light receiving devices arranged in a vertical direction and a horizontal direction and performing vertical transfer processing of reading out charge accumulated in the adjacent light receiving devices and transferring the read out charge in the vertical direction.

The clocks for charge readout and transfer in the vertical transfer parts are supplied via a resistor and a channel by a switch is connected in parallel to the resistor in a time period of the charge readout from the light receiving devices.

As described above, since the resistor is connected in the transmission channel of the clocks supplied to the vertical transfer parts, the waveform of the transfer clock is optimized and the transfer efficiency can be improved. On the other hand, at the readout operation, another channel is connected in parallel to the resistor by the switch, the influence of reducing the voltage change rate of the clock waveform by the resistor is eliminated, and incomplete signal readout from the light receiving devices may be prevented.

According to the embodiment of the invention, when the vertical transfer parts serve as both readout electrodes and transfer electrodes, the clock supplied to the electrodes serving as both electrodes may be supplied via the resistor at transfer, and the same transfer efficiency as that in related art may be obtained. Further, at readout from the light receiving devices, the clock may be supplied without the influence of the resistor, and incomplete signal readout from the light receiving devices may be prevented at readout from the light receiving devices. Therefore, both the improvement in the transfer efficiency at transfer and the improvement in the readout characteristics at readout may be realized at the same time.

BRIEF DESCRIPTION OF THE DRAWINGS

FIGS. 4A to 4C are explanatory diagrams showing examples of applied voltages according to the first embodiment of the invention.

FIG. 5A shows a waveform at vertical transfer voltage input and FIG. 5B shows a waveform at readout voltage input.

FIG. 6 is a configuration diagram showing an example of a CCD-type solid-state imaging device according to a second embodiment of the invention.

FIG. 7 is a configuration diagram showing an example of a CCD-type solid-state imaging device in related art.

FIG. 8A shows a waveform at vertical transfer voltage input and FIG. 8B shows a waveform at readout voltage input.

DESCRIPTION OF PREFERRED EMBODIMENTS

Examples of embodiments of the invention will be explained in the following order.
1. Explanation of First Embodiment
1.1 Configuration of solid-state imaging device (FIG. 1)
1.2 Configuration of entire camera system (FIG. 2)
1.3 Explanation of drive pulses for vertical transfer (FIG. 3 and FIGS. 4A and 4B)
1.4 Specific examples of pulse waveforms (FIGS. 5A and 5B)
2. Explanation of Second Embodiment
3. Modified Examples of Embodiments
[1. Explanation of First Embodiment]
As below, the first embodiment of the invention will be explained with reference to FIGS. 1 to 5B.
[1.1 Configuration of Solid-State Imaging Device]
First, a configuration of a CCD-type solid-state imaging device of the first embodiment will be explained with reference to FIG. 1. The CCD-type solid-state imaging device 100 in the example of the first embodiment shown in FIG. 1 is incorporated in a camera system, which will be described later, for outputting imaging signals.

Figure 1:
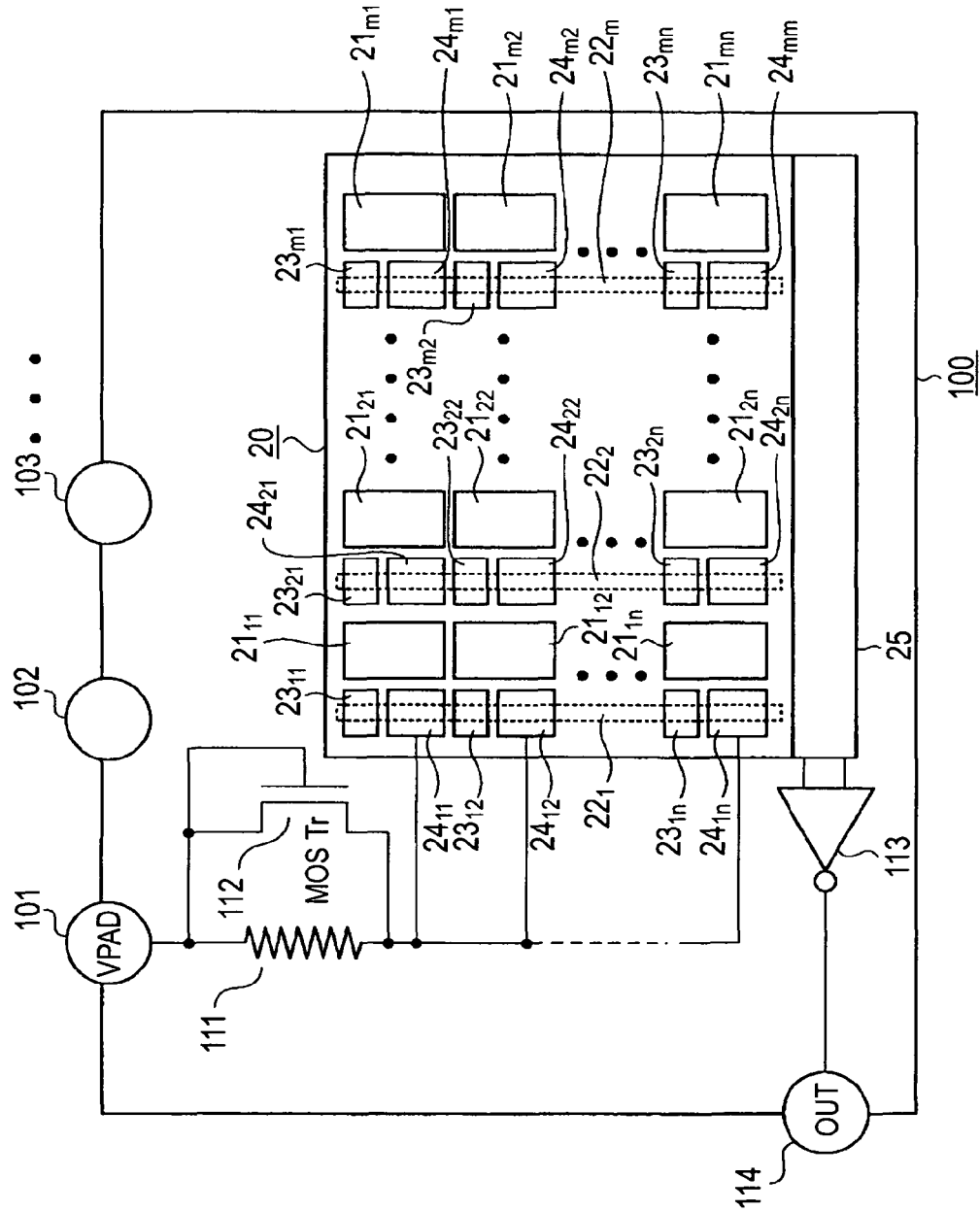
FIG. 1 is a configuration diagram showing an example of a CCD-type solid-state imaging device according to a first embodiment of the invention.

The CCD-type solid-state imaging device 100 shown in FIG. 1 includes an imaging region 20. Within the imaging region 20, photodiodes $21_{11}$ to $21_{mn}$ as light receiving devices in the numbers of n in the vertical direction and m in the horizontal direction are arranged. The respective photodiodes form pixels and the respective photodiodes 21 accumulate signal charge by receiving light. The configuration within the imaging region 20 is the same as the configuration in FIG. 7 as a related art example explained in the part of Background Art and the same signs as those in the imaging region 20 in FIG. 7 are assigned to the respective parts within the imaging region 20 in FIG. 1, and the configuration within the imaging region 20 will briefly be explained again as below.

On the sides of the photodiodes $21_{11}$ to $21_{1n}$, $21_{21}$ to $21_{2n}$, . . . , $21_{m1}$ to $21_{mn}$, vertical transfer channels $22_1$, $22_2, \ldots, 22_n$ are arranged. The vertical transfer channels $22_1$ to $22_n$ include CCDs as charge coupled devices and transfer charge. As shown in FIG. 1, in the respective vertical transfer channels $22_1$ to $22_n$, transfer electrodes $23_{11}$ to $23_{mn}$ and readout-transfer electrodes $24_{11}$ to $24_{mn}$ are alternately arranged. The readout-transfer electrodes $24_{11}$ to $24_{mn}$ read out signal charge accumulated in the adjacent photodiodes $21_{11}$ to $21_{mn}$, and transfer the read out signal charge (or transferred signal charge) to the next transfer electrodes (the lower electrodes in the drawing). The transfer electrodes $23_{11}$ to $23_{mn}$ transfer the charge transferred from the upper electrodes 24 to the lower electrodes 24.

The readout operation and the transfer operation in these readout-transfer electrodes $24_{11}$ to $24_{mn}$ and the transfer operation in the transfer electrodes $23_{11}$ to $23_{mn}$ are performed in synchronization with a vertical transfer clock externally supplied via an input terminal 101 or the like. The clock to be supplied to the readout-transfer electrodes $24_{11}$ to $24_{mn}$ is supplied to the input terminal 101. The details of the vertical transfer clock will be described later.

To the lower ends of the respective vertical transfer channels $22_1$ to $22_n$, a horizontal transfer channel 25 is connected, and the charge transferred in the respective vertical transfer channels $22_1$ to $22_n$ is supplied to different electrode positions of the horizontal transfer channel 25 with respect to vertical each line. The charge transferred to the horizontal transfer channel 25 is supplied to an output circuit 113 connected to the end of the horizontal transfer channel 25 in synchronization with a horizontal transfer clock, and imaging signals are externally output from an output terminal 114 connected to the output circuit 113.

Further, the CCD-type solid-state imaging device 100 in the example of the embodiment supplies the clocks for controlling the readout operation and the transfer operation in the readout-transfer electrodes $24_{11}$ to $24_{mn}$ within the vertical transfer channels $22_1$ to $22_n$ from the input terminal 101. The CCD-type solid-state imaging device 100 includes plural input terminals 101, 102, 103, . . . as input terminals of drive signals for controlling imaging, and the vertical transfer clock is supplied to the input terminal 101 of them. The vertical transfer clock is supplied from a clock generating unit 35 in FIG. 2, which will be described later.

The input terminal 101 is connected to one end of a resistor 111, and the other end of the resistor 111 is connected to the respective readout-transfer electrodes $24_{11}$ to $24_{mn}$. The resistor 111 has a resistance value selected between about several tens of ohms to several hundreds of ohms, for example. The resistance value of the resistor 111 is selected to be a value for optimization of the pulse waveform at transfer. Further, a MOS transistor 112 as a switch device is connected between the one end and the other end of the resistor 111. The MOS transistor 112 has on-resistance smaller than the resistance value of the resistor 111.

The MOS transistor 112 is an NPN-type (N-channel) MOS transistor here, and the one end (the terminal 101 side) of the resistor 111 is connected to the drain electrode and the other end (the side connected to the vertical transfer channels) of the resistor 111 is connected to the source electrode. The gate electrode is connected to the drain electrode and a voltage applied to a substrate forming the CCD-type solid-state imaging device 100 is supplied thereto as a bias voltage.

The operation of the MOS transistor 112 is controlled according to the state of the vertical transfer clock. The details will be described later, but, in simple explanation, when the readout-transfer electrodes $24_{11}$ to $24_{mn}$ read out charge from the adjacent photodiodes $21_{11}$ to $21_{mn}$, the transistor is turned on, and, when the readout-transfer electrodes $24_{11}$ to $24_{mn}$ performs the transistor operation, the transistor is turned off.

[1.2 Configuration of Entire Camera System]

Next, an outline of the camera system in which the CCD-type solid-state imaging device 100 in the example of the embodiment is incorporated will be explained.

Figure 2:
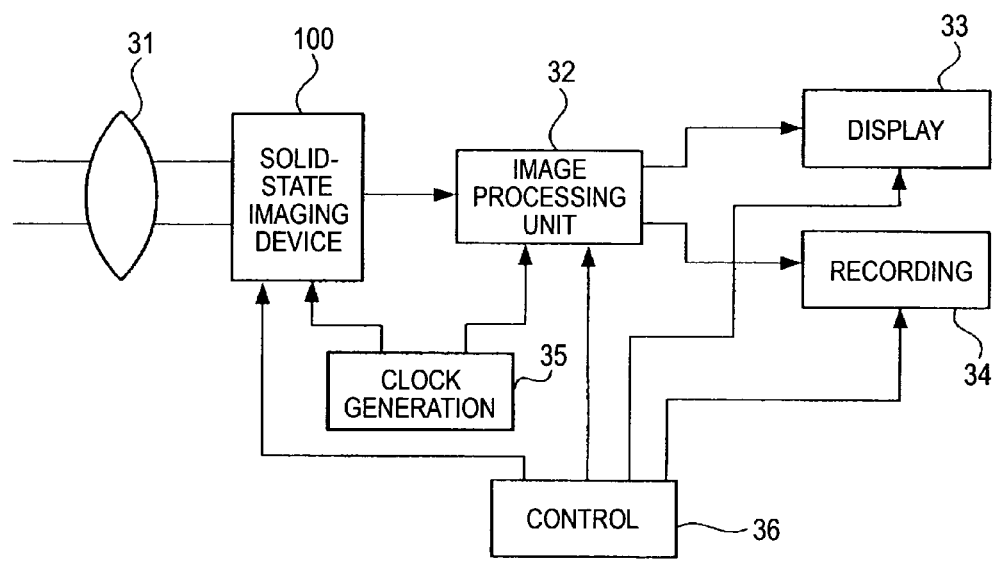
FIG. 2 is a block diagram showing a configuration example of an entire camera system according to the first embodiment of the invention.

FIG. 2 shows a configuration example of the camera system.

On the basis of image light entering the imaging region 20 of the solid-state imaging device 100 via a lens 31, signals of the respective pixels are generated in the solid-state imaging device 100 and imaging signals are output from the output terminal 114. The imaging signals output from the solid-state imaging device 100 are supplied to an image processing unit 32. In the image processing unit 32, various kinds of image processing for providing proper characteristics to the imaging signals is performed and conversion processing of converting the imaging signals into image signals in a predetermined format is performed. The image signals obtained in the image processing unit 32 are supplied to a display unit 33 including a view finder and displayed thereon. Further, the image signals obtained in the image processing unit 32 are supplied to a recording unit 34 with recording media including a semiconductor memory, a hard disc, an optical disc, and the like, and recorded in the various recording media. Furthermore, the image signals are externally output according to need.

The imaging processing in the solid-state imaging device 100 and the image processing in the image processing unit 32 are performed in synchronization with clocks supplied from the clock generating unit 35. The vertical transfer clock and the horizontal transfer clock supplied to the vertical transfer channels and the horizontal transfer channel within the solid-state imaging device 100 are also supplied from the clock generating unit 35.

Further, the processing in the respective units within the camera is executed based on the control of a control unit 36.

[1.3 Explanation of Drive Pulses for Vertical Transfer]

Next, a configuration of the vertical transfer clock supplied to the input terminal 101 of the solid-state imaging device 100 and an operation by the vertical transfer clock will be explained.

Figure 3:
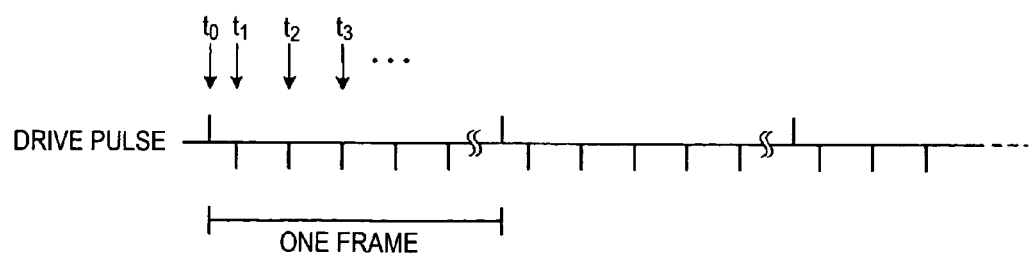
FIG. 3 is a waveform chart showing an example of a vertical drive pulse according to the first embodiment of the invention.

FIG. 3 shows an outline of the vertical transfer clock supplied to the readout-transfer electrodes $24_{11}$ to $24_{mn}$ in FIG. 1. The vertical transfer clock is a clock in synchronization with a frame period in which imaging is performed in the solid-state imaging device 100, and a positive readout pulse is supplied at time t0 within one frame period. With the positive readout pulses, the operation that the readout-transfer electrodes $24_{11}$ to $24_{mn}$ readout charge from the adjacent photodiodes $21_{11}$ to $21_{mn}$ is performed.

Then, negative transfer pulses are sequentially supplied at times t1, t2, t3, . . . in the constant period corresponding to the time period of one horizontal line. With the transfer pulses, the transfer operation of charge is performed in the readout-transfer electrodes $24_{11}$ to $24_{mn}$ within the vertical transfer channels. The shapes of the specific pulse waveforms of the readout pulse and the transfer pulse will be described later. Although the transfer pulses are also supplied to the transfer electrodes $23_{11}$ to $23_{mn}$ shown in FIG. 1, the explanation of the pulses supplied to the electrodes that performs only transfer is omitted here.

Through the supply of the vertical transfer clock, the charge within the vertical transfer channels is sequentially transferred to the horizontal transfer channel 25 within one frame period and output as imaging signals from the output circuit 113 side connected to the horizontal transfer channel 25.

Next, FIGS. 4A to 4C show voltages of the vertical transfer clock obtained at the input terminal 101 and states of the MOS transistor 112. As the states of the MOS transistor 112, potentials of the drain (N-type channel region on the left), the gate (P-type channel region at the center), and the source (N-type channel region on the right) are shown at the bottom. In the case of the example, a voltage of the substrate forming the solid-state imaging device is applied to the N-type channel region.

FIG. 4A shows a state in which the vertical transfer clock Vclk remains 0 V in the standby state. In this state, the potentials of the drain and the source of the MOS transistor 112 remain 0 V and the substrate potential is supplied to the gate. In the standby state, the MOS transistor 112 is off.

FIG. 4B shows a state in which the transfer pulse is supplied as the vertical transfer clock Vclk having the voltage value of the transfer pulse of −7.5 V. In this state, the potential of the drain is −7.5 V, and the substrate potential lower than −7.5 V is supplied to the gate. In the state in which the transfer pulse is supplied, the MOS transistor 112 remains off.

FIG. 4C shows a state in which the readout pulse is supplied as the vertical transfer clock Vclk having the voltage value of the readout pulse of 12 V. In this state, the potential of the drain of the MOS transistor 112 is 12 V, and the substrate potential lower than 12 V is supplied to the gate. In the state in which the readout pulse is supplied, the MOS transistor 112 is turned on.

As shown in FIGS. 4A to 4C, using the circuit configuration of FIG. 1, in the state in which the transfer pulse is supplied, the MOS transistor 112 remains off, and, in the state in which the readout pulse is supplied, the MOS transistor 112 is turned on. Therefore, when the transfer pulses are supplied to the respective readout-transfer electrodes $24_{11}$ to $24_{mn}$ shown in FIG. 1, the transfer pulses are supplied with the resistor 111 connected and the pulse waveform is optimized by the action of the resistor 111.

On the other hand, when the readout pulse is supplied, the MOS transistor 112 is turned on, and accordingly, the readout pulses are supplied to the respective readout-transfer electrodes $24_{11}$ to $24_{mn}$ with a combined resistance of the resistor 111 and the on-resistance of the transistor 112 connected. Therefore, the pulse waveform of the readout pulses is shaped by the combined resistance of the resistor 111 and the on-resistance of the transistor 112. Here, the on-resistance of the MOS transistor 112 is smaller than the resistance value of the resistor 111.

[1.4 Specific Examples of Pulse Waveforms]

Figure 5A:
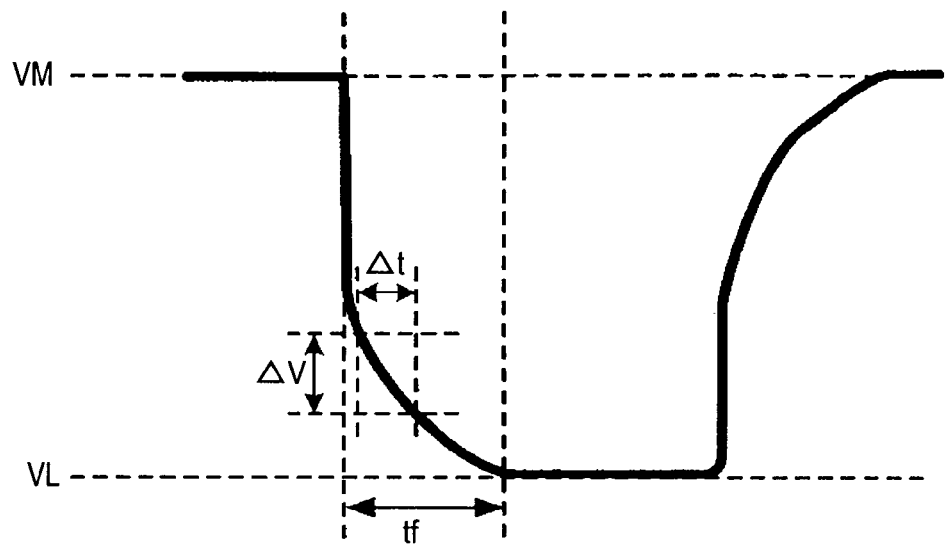
FIGS. 5A and 5B are waveform charts showing clock waveforms according to the first embodiment of the invention.
Figure 5B:
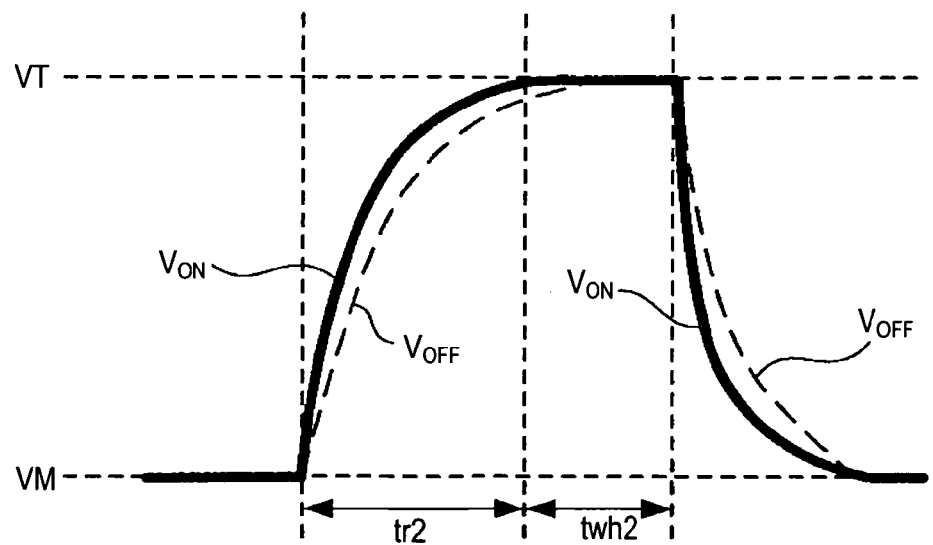

FIGS. 5A and 5B show specific examples of pulse waveforms of the transfer pulse and the readout pulse of the vertical transfer clock Vclk in the example of the embodiment.

The pulse waveform of the clock supplied at transfer within the vertical transfer channels is a voltage waveform falling from a reference value VM to a predetermined voltage VL as shown in FIG. 5A. For example, the reference value VM is set to 0 V, and the predetermined voltage VL is set to −7.5 V. Note that the pulse shown in FIG. 5A has a waveform optimized by the action of the resistor 111 and different from the waveform obtained at the input terminal 101.

On the other hand, the pulse waveform of the readout pulse supplied at charge readout from the photodiodes is a voltage waveform rising from the reference value VM to a predetermined voltage VT as shown in FIG. 5B and having reversed polarity to that of the pulse waveform at transfer. For example, the reference value VM is set to 0 V, and the predetermined voltage VT is set to 12 V.

Figure 8A:
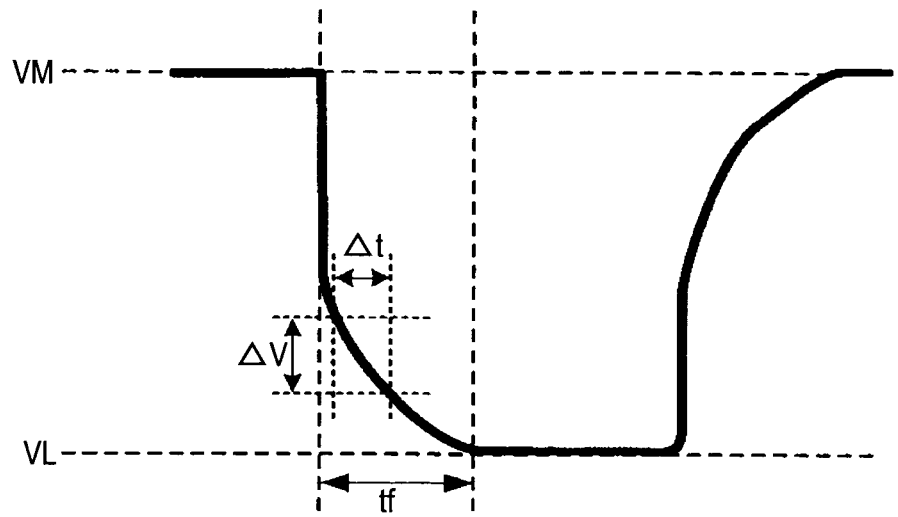
FIGS. 8A and 8B are waveform charts showing clock waveforms in related art.

The transfer pulse shown in FIG. 5A has a waveform by which the transfer efficiency of the vertical transfer in the vertical transfer channels including CCDs is improved because the pulse is supplied to the respective electrodes via the resistor 111. That is, as has been explained in FIGS. 8A and 8B, when the voltage of the vertical transfer pulse waveform shown in FIG. 5A transits from VM to VL, the smaller the value of $\Delta V/\Delta t$ as a change rate of the voltage and the larger the value of time tf in which the waveform changes, the more improved the transfer efficiency. In order to improve the transfer efficiency, the resistor 111 is inserted to blunt the waveform of the transfer pulse. The waveform of the transfer pulse shown in FIG. 5A is basically the same waveform as the waveform of the transfer pulse shown in FIG. 8A as a related art example.

Further, when the charge is readout from the photodiodes, the pulse waveform of the readout pulse supplied to the electrodes is a voltage waveform rising from the reference value VM to the predetermined voltage VT as shown by a solid line characteristic $V_{ON}$. For example, the reference value VM is set to 0 V, and the predetermined voltage VT is set to 12 V.

In the time period in which the readout pulse is supplied, as explained in FIGS. 4A to 4C, the MOS transistor 112 is on and not affected by the blunting of the waveform by the resistor 111. Accordingly, the solid line characteristic $V_{ON}$ having the change rate of the voltage not affected by the resistor 111 and relatively sharp rising of the voltage is provided.

Figure 8B:
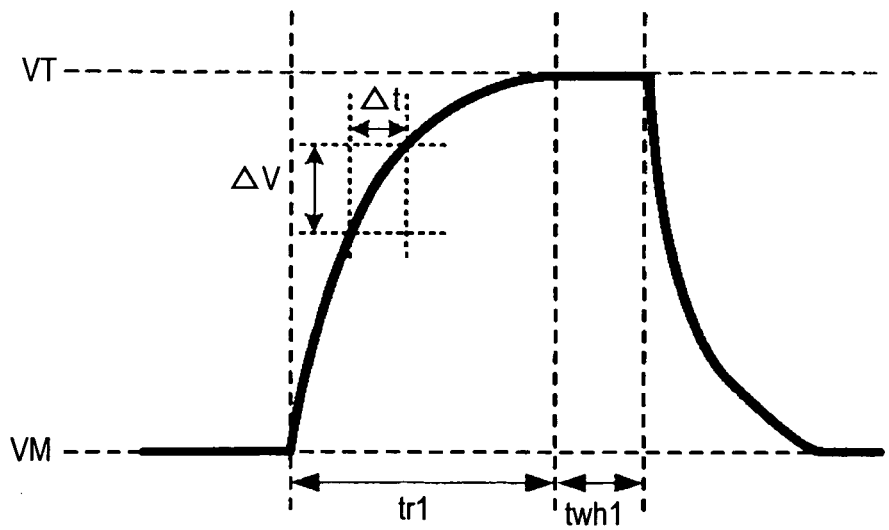

The characteristic $V_{OFF}$ shown by a broken line is an assumed waveform when the MOS transistor 112 is off, and the waveform when the MOS transistor 112 is off is the same as the waveform shown in FIG. 8B.

When the pulse waveform of the readout pulse of the solid line characteristic $V_{ON}$ in FIG. 5B is used, the time period tr2 in which the voltage changes becomes shorter, and relatively, the length of the time period twh2 in which the voltage VT is applied is secured longer. When the time period twh2 in which the specified voltage VT is applied is longer, the signals photoelectrically converted in each photodiode 21 is completely transferred to the vertical transfer channel. Accordingly, even in the configuration in which the resistor 111 is inserted into the supply channel of the vertical transfer pulse, there is no change in the waveform of the readout pulse due to the influence of the resistor 111, the charge received by the photodiodes 21 may completely be read out, and occurrence of defects such as black flaw may be avoided.

Therefore, according to the configuration of the embodiment, the vertical transfer may efficiently be performed and the charge readout from the light receiving devices may completely be performed. In related art, in the case of using the electrodes of the vertical transfer channels have the configuration for both vertical transfer within the vertical transfer channels and readout from the light receiving devices, as explained using FIGS. 8A and 8B, it has been impossible to obtain these effects at the same time, however, both effects may be obtained according to the configuration of the embodiment. Further, with the improvement of the vertical transfer efficiency and prevention of failed readout from the photodiodes to the vertical transfer channels, the power of the effective input clock bias may be reduced and the power consumption of the solid-state imaging device can be reduced.

Note that, regarding the MOS transistor 112, it is preferable to satisfy the following conditions so that the transistor may reliably be turned off at transfer and may reliably be turned on at readout.

That is, since the on-operation is necessary at application of the positive voltage of the readout clock, it is preferable that the NPN-type is used as the MOS transistor 112 and the gate voltage changing to off is set to near 0 V or the slightly positive bias side.

The point will be explained as follows. Since the negative potential is applied at transfer to the gate of the MOS transistor 112, it is necessary to apply the same bias value as the negative voltage applied to the gate to the P-well region around the transistor. If the depression type is employed as the channel structure of the MOS transistor 112, in the transition time period of the vertical transfer pulse from 0 V to −7.5 V, a time period in which the transistor is not turned off appears. Accordingly, the clock via the combined resistance of the resistor 111 and the on-resistance of the MOS transistor 112 at the vertical transfer is applied to the vertical transfer electrodes.

On the other hand, if the strongly-enhanced type is employed as the MOS transistor 112, at on-operation of inputting the readout clock, the voltage effect between drain and source becomes greater. If such is the case, the readout voltage itself applied from the input terminal 101 drops before applied to the electrodes of the vertical transfer channels, and, contrary to the original purpose, defects may occur in the readout from the photodiodes. Accordingly, it is desirable that the voltage Vth changing to off of the MOS transistor 112 is set to near 0 V or the slightly positive bias side. Further, with respect to the setting of the ratio W/L of the channel width W to the channel length L of the MOS transistor 112, because the resistance value at application of readout pulse is the combined resistance of the resistor 111 and the on-resistance of the transistor 112, setting providing the on-resistance as low as possible may be desired. If the resistor 111 has a value of about several hundreds of ohms, by securing W/L of the transistor 112 to be larger to some degree, the time period tr2 in which the readout voltage changes can be shorter by about several hundreds of nanometers, for example.

[2. Explanation of Second Embodiment]

Next, an example of the second embodiment of the invention will be explained with reference to FIG. 6. In FIG. 6, the same signs are assigned to the parts corresponding to those in FIGS. 1 to 5B explained in the first embodiment.

The second embodiment is applied to a CCD-type solid-state imaging device incorporated in the camera system, and the configuration shown in FIG. 2 is applicable to the entire configuration of the camera system.

FIG. 6 shows a configuration of a CCD-type solid-state imaging device in an example of the embodiment. The CCD-type solid-state imaging device 200 in the example of the second embodiment shown in FIG. 6 is different from the form of the first embodiment in that driving of the MOS transistor connected in parallel to the resistor is performed by an external control signal.

The CCD-type solid-state imaging device 200 shown in FIG. 6 includes an imaging region 20. The configuration within the imaging region 20 is the same as that of the imaging region 20 of the CCD-type solid-state imaging device 100 shown in FIG. 1. That is, photodiodes $21_{11}$ to $21_{mn}$ as light receiving devices in the numbers of n in the vertical direction and m in the horizontal direction are arranged, and vertical transfer channels $22_1$, $22_2$, ..., $22_n$ are arranged adjacent to the photodiodes of the respective vertical rows. In the respective vertical transfer channels $22_1$ to $22_n$, transfer electrodes $23_{11}$ to $21_{mn}$ and readout-transfer electrodes $24_{11}$ to $24_{mn}$ are alternately arranged.

The readout operation and the transfer operation in these readout-transfer electrodes $24_{11}$ to $24_{mn}$ and the transfer operation in the transfer electrodes $23_{11}$ to $23_{mn}$ are performed in synchronization with a vertical transfer clock externally supplied via an input terminal 201 or the like. The vertical transfer clock to be supplied to the readout-transfer electrodes $24_{11}$ to $24_{mn}$ is supplied to the input terminal 201. Further, to an input terminal 202, a control signal to be applied to the gate of a transistor 212, which will be described later, is supplied. The clock and the control signal supplied to these input terminals 201, 202 are generated in the clock generating unit 35 shown in FIG. 2, for example.

To the lower ends of the respective vertical transfer channels $22_1$ to $22_n$, a horizontal transfer channel 25 is connected. The charge transferred to the horizontal transfer channel 25 is supplied to an output circuit 213 connected to the end of the horizontal transfer channel 25 in synchronization with a horizontal transfer clock, and imaging signals are externally output from an imaging signal output terminal 214 connected to the output circuit 213.

The input terminal 201 of the vertical transfer clock is connected to one end of a resistor 211, and the other end of the resistor 211 is connected to the respective readout-transfer electrodes $24_{11}$ to $24_{mn}$. The resistor 211 has a resistance value selected between about several tens of ohms to several hundreds of ohms, for example. The resistance value of the resistor 211 is selected to be a value for optimization of the pulse waveform at transfer. Further, a MOS transistor 212 as a switch device is connected between the one end and the other end of the resistor 211. The MOS transistor 212 has on-resistance smaller than the resistance value of the resistor 211.

The MOS transistor 212 is an NPN-type (N-channel) MOS transistor here, and the one end (the terminal 201 side) of the resistor 211 is connected to the drain electrode and the other end (the side connected to the vertical transfer channels) of the resistor 211 is connected to the source electrode. To the gate electrode, the control signal input to the input terminal 202 is supplied.

The control signal input to the input terminal 202 is a voltage that turns on the MOS transistor 212 in a time period in which the readout operation from the phototransistors is performed in the readout-transfer electrodes $24_{11}$ to $24_{mn}$ and a voltage that turns the transistor off in the other time periods. Therefore, also, in the time period in which the transfer operation is performed in the readout-transfer electrodes $24_{11}$ to $24_{mn}$, the MOS transistor 212 is off.

According to the configuration, in the solid-state imaging device 200 of the embodiment, as is the case of the solid-state imaging device 100 in the example of the first embodiment, the MOS transistor connected in parallel to the resistor is turned on and off, and characteristics of both the transfer operation and the readout operation in the vertical transfer channels may be preferable.

In the case of the second embodiment, specific waveforms of the transfer pulse and the readout pulse of the vertical transfer clock are not shown, however, they may be the same waveforms as the waveforms in FIGS. 5A and 5B described above, and the same advantage as that of the first embodiment may be obtained.

In the case of the example of the second embodiment, the gate voltage of the MOS transistor 212 may be set by the external control signal, and accordingly, the degree of freedom with respect to the configuration of the MOS transistor is higher than that in the case of the first embodiment. That is, in the case of the first embodiment, the transistor that turns on and off properly by the substrate voltage is necessary, however, in the case of the example, the purpose may be achieved by properly setting the voltage value of the control signal to be supplied externally. Note that, in the case of the example of the second embodiment, it is necessary that the control signal supplied to the input terminal 202 is generated, and the control configuration becomes complex by the necessity.

[3. Modified Examples of Embodiments]

In the above described respective embodiments, the MOS transistor is connected in parallel to the internal resistor for changing the resistance value when the vertical transfer clock is supplied, however, a switch having a configuration other than the MOS transistor may be connected for changing the resistance value in the same manner.

Further, in the configurations shown in the first embodiment and the second embodiment, the transistor is connected in parallel to the buried resistor and, when the transistor is turned on, the combined resistance of the resistor and the on-resistance of the transistor is obtained. On the other hand, in the time period in which the readout pulse is supplied, the resistor may be separated and connection to another channel may be switched by a transistor (switch). In either case, a configuration of switching between the resistance value that improves the transfer efficiency in the time period in which the transfer pulse is supplied and the lower resistance value in the time period in which the readout pulse is supplied may be employed.

Furthermore, in the above described embodiments, the voltages applied to the transistor shown in FIGS. 4A to 4C and the pulse waveforms of the respective clocks shown in FIGS. 5A and 5B are only examples, and the invention is not limited to them.

The present application contains subject matter related to that disclosed in Japanese Priority Patent Application JP 2009-279779 filed in the Japan Patent Office on Dec. 9, 2009, the entire contents of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A CCD-type solid-state imaging device comprising:
plural light receiving devices arranged in a vertical direction and a horizontal direction;
plural vertical transfer parts that are arranged along vertical rows of the arranged plural light receiving devices, read out charge accumulated in the adjacent light receiving devices, and transfer the read out charge in the vertical direction;
a horizontal transfer part that is supplied with the charge transferred in the plural vertical transfer parts and transfers the supplied charge in the horizontal direction;
an output part that outputs the charge transferred in the vertical transfer parts;
an input terminal for readout and transfer clocks that command readout of the charge from the light receiving devices and transfer of the read out charge in the vertical transfer parts;
a resistor connected between the input terminal for readout and transfer clocks and a clock supply part of the vertical transfer parts; and
a switch part that is connected to the resistor in parallel and switches between the charge readout from the light receiving devices and the charge transfer in the vertical transfer parts.

2. The CCD-type solid-state imaging device according to claim 1, wherein the switch part includes a field-effect transistor that turns on and off by a voltage applied to a substrate forming an imaging part in which the light receiving devices are arranged, and
the field-effect transistor turns on at the charge readout from the light receiving devices in the vertical transfer parts and turns off at the transfer within the vertical transfer parts.

3. The CCD-type solid-state imaging device according to claim 2, wherein, in clocks obtained at the input terminal for readout and transfer clocks, polarity of a pulse in a time period in which the charge readout is performed and polarity of a pulse in a time period in which the charge transfer is performed are opposite.

4. The CCD-type solid-state imaging device according to claim 1, wherein the switch part turns on at the charge readout from the light receiving devices in the vertical transfer parts and turns off at the transfer within the vertical transfer parts by a signal externally supplied.

5. A driving method of a CCD-type solid-state imaging device comprising the steps of:
using vertical transfer parts that are arranged along vertical rows of plural light receiving devices arranged in a vertical direction and a horizontal direction and performing vertical transfer processing of reading out charge accumulated in the adjacent light receiving devices and transferring the read out charge in the vertical direction;
using a horizontal transfer part and performing horizontal transfer processing of transferring the charge transferred in the plural vertical transferring parts in the horizontal direction and output; and
supplying clocks for charge readout and transfer in the vertical transfer processing via a resistor and connecting another channel than the resistor to reduce a resistance value in a time period of the charge readout.

6. An imaging system comprising:
plural light receiving devices arranged in a vertical direction and a horizontal direction;
plural vertical transfer parts that are arranged along vertical rows of the arranged plural light receiving devices, read out charge accumulated in the adjacent light receiving devices, and transfer the read out charge in the vertical direction;
a horizontal transfer part that is supplied with the charge transferred in the plural vertical transfer parts and transfers the supplied charge in the horizontal direction;
an output part that outputs the charge transferred in the vertical transfer parts as imaging signals;
an input terminal for readout and transfer clocks that command readout of the charge from the light receiving devices and transfer of the read out charge in the vertical transfer parts;
a resistor connected between the input terminal for readout and transfer clocks and a clock supply part of the vertical transfer parts;
a switch part that is connected to the resistor in parallel and switches between the charge readout from the light receiving devices and the charge transfer in the vertical transfer parts; and
an imaging signal processing part that processes the imaging signals output from the output part.

* * * * *